United States Patent
Chen et al.

(10) Patent No.: US 9,614,502 B2
(45) Date of Patent: Apr. 4, 2017

(54) ACCURATE SAMPLE LATCH OFFSET COMPENSATION SCHEME

(71) Applicant: QUALCOMM Incorporated, San Diego, CA (US)

(72) Inventors: Minhan Chen, Cary, NC (US); Kenneth Luis Arcudia, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/818,091

(22) Filed: Aug. 4, 2015

(65) Prior Publication Data

US 2017/0040983 A1 Feb. 9, 2017

(51) Int. Cl.
*H03K 3/356* (2006.01)

(52) U.S. Cl.
CPC .............. *H03K 3/356104* (2013.01)

(58) Field of Classification Search
USPC ........ 327/115, 116, 117, 118, 199, 355–360, 327/202, 203, 208–215, 218; 377/47, 48
See application file for complete search history.

(56) References Cited

U.S. PATENT DOCUMENTS

| | | | |
|---|---|---|---|
| 6,392,443 B1* | 5/2002 | Gauthier | H03K 5/01 326/112 |
| 6,426,674 B1 | 7/2002 | Davidescu | |
| 7,109,697 B1 | 9/2006 | Atrash et al. | |
| 7,420,410 B2 | 9/2008 | Ohba | |
| 7,479,818 B2* | 1/2009 | Park | G11C 7/065 327/218 |
| 7,728,632 B1 | 6/2010 | Bi | |
| 8,068,080 B2 | 11/2011 | Nishimura | |
| 8,476,971 B2 | 7/2013 | Peng et al. | |
| 2007/0252630 A1* | 11/2007 | Sumesaglam | G11C 7/1078 327/218 |
| 2010/0315149 A1* | 12/2010 | Wu | H03K 3/356139 327/307 |
| 2011/0234440 A1* | 9/2011 | Danjo | H03K 3/356139 341/158 |
| 2012/0086494 A1 | 4/2012 | Asada et al. | |
| 2012/0106687 A1 | 5/2012 | Bulzacchelli et al. | |

(Continued)

OTHER PUBLICATIONS

Son S., et al., "A 2.3-mW, 5-Gb/s Low-Power Decision-Feedback Equalizer Receiver Front-End and its Two-Step, Minimum Bit-Error-Rate Adaptation Algorithm", IEEE Journal of Solid-State Circuits, vol. 48, No. 11, Nov. 2013, pp. 2693-2704.

(Continued)

*Primary Examiner* — Brandon S Cole
(74) *Attorney, Agent, or Firm* — Loza & Loza LLP

(57) ABSTRACT

A receiver according to one aspect comprises a latch configured to sample a data signal according to a sampling clock signal, and a plurality of offset-compensation segments, wherein each of the segments is coupled to an internal node of the latch. Each of the segments comprises a compensation transistor, and a step-adjustment transistor coupled in series with the compensation transistor. The receiver further comprises an offset controller configured to selectively turn on one or more of the compensations transistors to reduce an offset voltage of the latch, and a bias circuit configured to apply a bias voltage to a gate of each of one or more of the step-adjustment transistors.

16 Claims, 7 Drawing Sheets

(56) References Cited

U.S. PATENT DOCUMENTS

2014/0132437 A1* 5/2014 Danjo .................. H03M 1/361
                                                                                             341/159
2016/0197583 A1* 7/2016 Lin ..................... H03D 7/1441
                                                                                             327/355

OTHER PUBLICATIONS

Ellersick W., et al., "GAD: A 12-GS/s CMOS 4-bit A/D converter for an equalized multi-level link," VLSI Circuits, Symposium on Digest of Technical Papers, Jun. 17, 1999, pp. 49-52, XP032396882, DOI: 10.1109/VLSIC.1999.797232, ISBN: 978-4-930813-95-4, p. 50, paragraph 15-paragraph 17; figures 3,4 p. 50, paragraph 23-p. 51.

International Search Report and Written Opinion—PCT/US2016/041002—ISA/EPO—Oct. 10, 2016.

Okazawa T., et al., "A Digitally Calibrated Dynamic Comparator using Time-Domain Offset Detection," Analog Integrated Circuits and Signal Processing, Springer New York LLC, US, vol. 81 (3), Sep. 9, 2014, pp. 561-570, XP035382918, ISSN: 0925-1030, DOI: 10.1007/S10470-014-0410-1, [retrieved on Sep. 9, 2014], p. 562, paragraph 2, figure 2.

Yang C.K.K., et al., "A Serial-Link Transceiver based on 8-GSamples/s A/D and D/A Converters in 0.25-CMOS", IEEE Journal of Solid-State Circuits, IEEE Service Center, Piscataway, NJ, USA, vol. 36 (11), Nov. 1, 2001, XP011061642, ISSN: 0018-9200, p. 1686, paragraph II; figure 5.

\* cited by examiner

ACCURATE SAMPLE LATCH OFFSET COMPENSATION SCHEME

BACKGROUND

Field

Aspects of the present disclosure relate generally to latches, and more particularly, to offset compensation for latches.

Background

A latch may be used in a receiver to sample a data signal according to a sampling clock signal, and convert each data sample into a data bit. The latch may have an offset voltage due to, for example, component mismatches in the latch. The offset voltage may negatively impact performance of the receiver (e.g., cause closure of the data eye at the receiver). Accordingly, it is desirable to cancel out the offset voltage at the latch to improve performance of the receiver.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a receiver is described herein. The receiver comprises a latch configured to sample a data signal according to a sampling clock signal, and a plurality of offset-compensation segments, wherein each of the segments is coupled to an internal node of the latch. Each of the segments comprises a compensation transistor, and a step-adjustment transistor coupled in series with the compensation transistor. The receiver further comprises an offset controller configured to selectively turn on one or more of the compensation transistors to reduce an offset voltage of the latch, and a bias circuit configured to apply a bias voltage to a gate of each of one or more of the step-adjustment transistors.

A second aspect relates to a method for offset-voltage compensation. The method comprises turning on one or more compensation transistors, wherein each of the one or more compensation transistors provides an offset-compensation current for reducing an offset voltage of a latch. The method also comprises applying a bias voltage to a gate of each of one or more step-adjustment transistors, wherein each of the one or more step-adjustment transistors is coupled in series with a respective one of the one or more compensation transistors.

A third aspect relates to an apparatus for offset-voltage compensation. The apparatus comprises means for turning on one or more compensation transistors, wherein each of the one or more compensation transistors provides an offset-compensation current for reducing an offset voltage of a latch. The apparatus also comprises means for applying a bias voltage to a gate of each of one or more step-adjustment transistors, wherein each of the one or more step-adjustment transistors is coupled in series to a respective one of the one or more compensation transistors.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
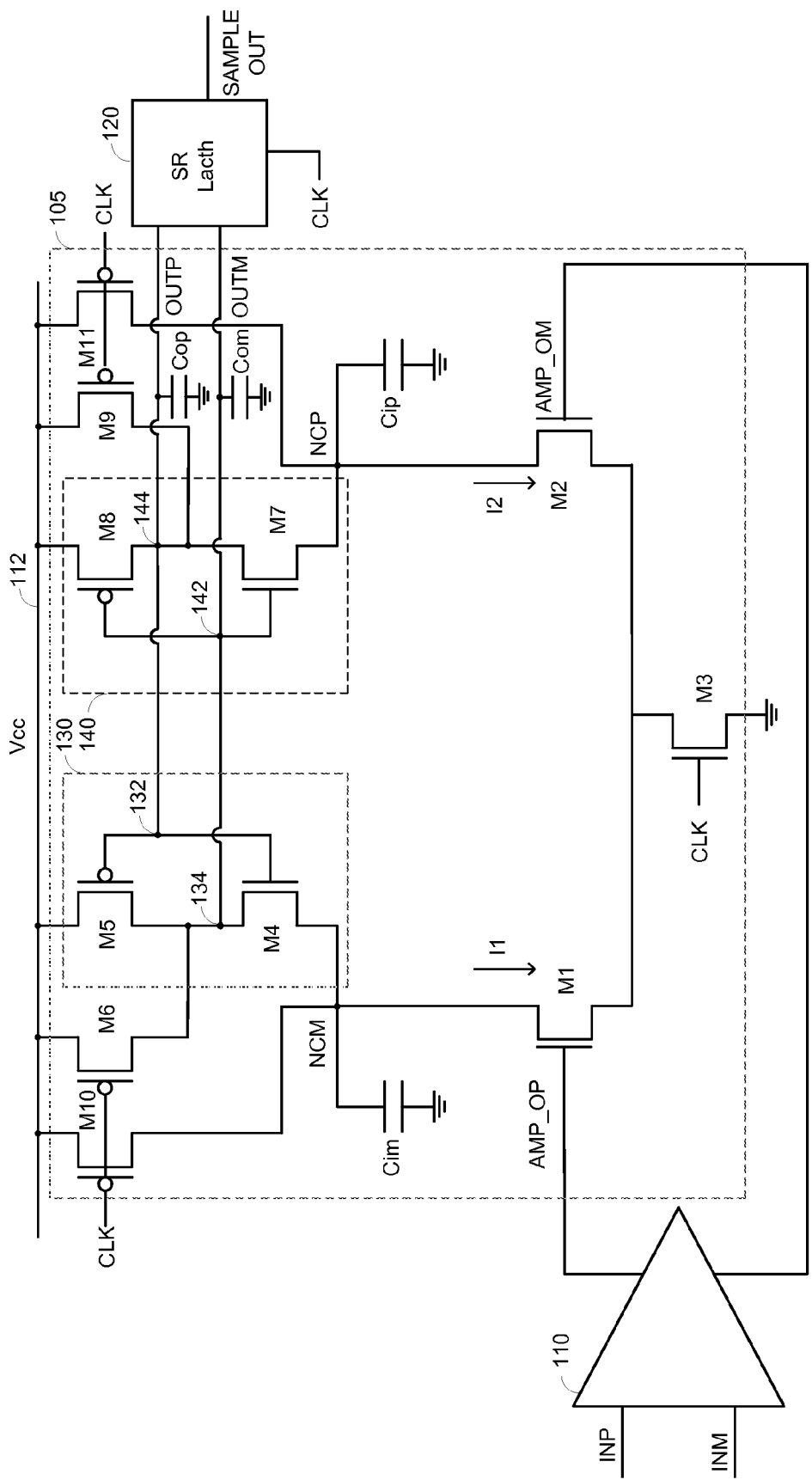
FIG. 1 shows an example of a strong-arm latch.

A sample latch may be used to sample an incoming data signal and to decide whether each sample of the data signal is a logic one or a logic zero (e.g., for each period of a sampling clock signal). In this regard, FIG. 1 shows an example of a sample latch comprising a strong-arm latch 105 and a set-reset (SR) latch 120.

The strong-arm latch 105 comprises a first input NMOS transistor M1 and a second input NMOS transistor M2 configured to receive a differential input voltage (AMP_OP and AMP_OM) from an input amplifier 110, as discussed further below. The strong-arm latch 105 also comprises two cross-coupled inverters 130 and 140 (i.e., back-to-back inverters 130 and 140), where a first one of the inverters 130 comprises PMOS transistor M5 and NMOS transistor M4 and a second one of the inverters 140 comprises PMOS transistor M8 and NMOS transistors M7. The output 134 of the first inverter 130 is coupled to the input 142 of the second inverter 140 (i.e., gates of PMOS transistor M8 and NMOS transistor M7), and the output 144 of the second inverter 140 is coupled to the input 132 of the first inverter 130 (i.e., gates of PMOS transistor M5 and NMOS transistor M4). The source of NMOS transistor M4 is coupled to the drain of the first input NMOS transistor M1 and the source of NMOS transistor M7 is coupled to the drain of the second input NMOS transistor M2.

The strong-arm latch 105 also comprises switching NMOS transistor M3 coupled between the sources of the input NMOS transistors M1 and M2 and ground, and switching PMOS transistors M6 and M9 coupled between the supply rail 112 and the outputs 134 and 144 of the inverters 130 and 140, respectively. The strong-arm latch 105 further comprises switching PMOS transistors M10 and M11 coupled between the supply rail 112 and internal nodes NCM and NCP, respectively. Internal node NCM is between the source of NMOS transistor M4 and the drain of the first input NMOS transistor M1, and internal node NCP is between the source of NMOS transistor M7 and the drain of the second input NMOS transistor M2, as shown in the example in FIG. 1. The switching transistors M3, M6, M9, M10 and M11 are clocked by a sampling clock signal CLK, as discussed further below. The sampling clock signal CLK may be provided by a clock recovery circuit that recovers the sampling clock signal from the data signal, a clock generator, etc. The strong-arm latch 105 also has internal capacitors Cim and Cip coupled to internal nodes NCM and NCP, respectively, and output capacitors Cop and Com coupled to the outputs 144 and 134 of the inverters 140 and 130, respectively.

In operation, the input amplifier 110 may receive a differential data signal (INP and INM) from a channel, and convert the data signal into a differential voltage (AMP_OP and AMP_OM) that is input to the first and second input NMOS transistors M1 and M2 of the strong-arm latch 105. The strong-arm latch 105 converts the differential input voltage (AMP_OP and AMP_OM) into a large differential output voltage (OUTP and OUTM), as discussed further below.

When the sampling clock signal CLK is low, switching PMOS transistors M6, M9, M10 and M11 are closed and switching NMOS transistor M3 is open. As a result, internal capacitors Cim and Cip are coupled to the supply voltage Vcc through switching PMOS transistors M10 and M11, respectively. Output capacitors Cop and Com are coupled to the supply voltage Vcc through switching PMOS transistors M9 and M6, respectively. As a result, internal capacitors Cim and Cip and output capacitors Cop and Com are each charged approximately to Vcc during the time that the sampling clock signal CLK is low (referred to as the "reset" phase or "pre-charge" phase). Further, the sources of the first and second NMOS transistors M1 and M2 are decoupled from ground by switching NMOS transistor M3 (which is open). This prevents the input NMOS transistors M1 and M2 from discharging internal capacitors Cim and Cip during the reset phase.

The data signal is not sensed during the reset phase. As discussed further below, internal capacitors Cim and Cip and output capacitors Cop and Com are pre-charged during the reset phase to prepare the strong-arm latch 105 to sense the data signal during a sensing phase following the reset phase.

When the sampling clock signal CLK goes high, the strong-arm latch 105 enters the sensing phase. The high clock signal causes switching PMOS transistors M6, M9, M10 and M11 to open, and switching NMOS transistor M3 to close. As a result, the internal capacitors Cim and Cip and the output capacitors Com and Cop are decoupled from the supply voltage Vcc. Also, the sources of the first and second input NMOS transistors are coupled to ground. Initially, the voltage across each of the internal capacitors Cim and Cip and each of the output capacitors Com and Cop may be approximately equal to Vcc.

The first and second input NMOS transistors M1 and M2 convert the differential input voltage (AMP_OP and AMP_OM) into drive currents I1 and I2, respectively. The drive current I1 from the first input NMOS transistor M1 (which is driven by AMP_OP) discharges internal capacitor Cim, and therefore reduces the voltage at internal node NCM. The drive current I2 from the second input NMOS transistor M2 (which is driven by AMP_OM) discharges internal capacitor Cip, and therefore reduces the voltage at internal node NCP. The drive currents I1 and I2 are a function of input voltages AMP_OP and AMP_OM, respectively. For example, if AMP_OP is greater than AMP_OM, then drive current I1 may be greater than drive current I2.

As the voltages at internal nodes NCM and NCP fall due to discharge of internal capacitors Cim and Cip by drive currents I1 and I2, respectively, NMOS transistors M4 and M7 begin to turn on. This is because the gate-to-source voltages of NMOS transistors M4 and M7 increase as the voltages at internal nodes NCM and NCP fall. As a result, NMOS transistors M4 and M7 provide conduction paths for drive currents I1 and I2 to discharge the output capacitors Cop and Com, and therefore lower the output voltages OUTP and OUTM.

Figure 2:
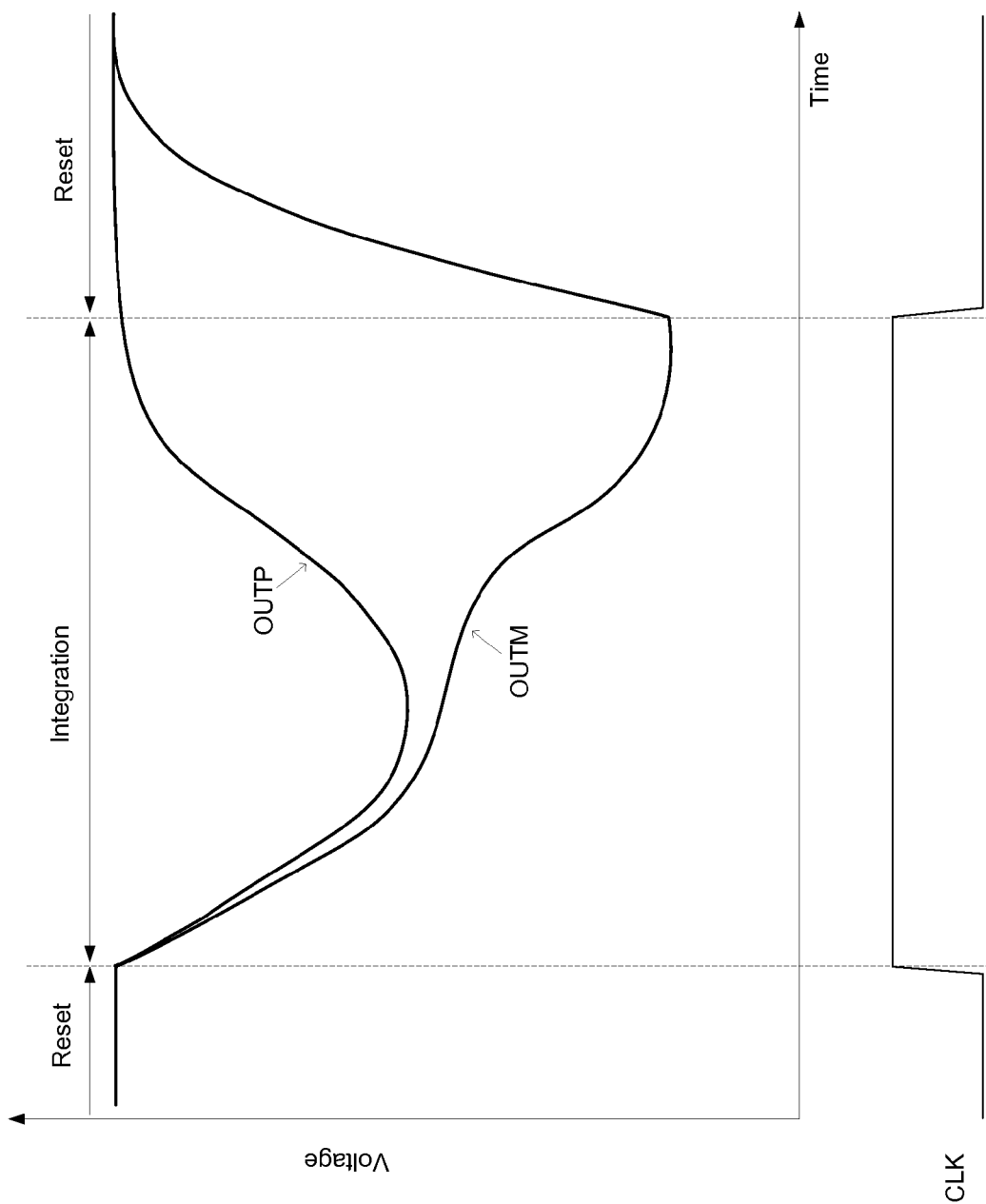
FIG. 2 is a plot showing exemplary output voltages of the strong-arm latch.

Thus, the output voltages OUTP and OUTM of the latch 105 decrease over time, an example of which is shown in FIG. 2. The output voltages OUTP and OUTM may decrease at different rates depending on the values of the input voltages AMP_OP and AMP_OM. For example, if input voltage AMP_OP is greater than input voltage AMP_OM, then drive current I1 may be stronger, causing output voltage OUTM to decrease faster, as shown in the example in FIG. 2.

When the output voltages OUTP and OUTM decrease to a certain point, the cross-coupled inverters 130 and 140 are activated, causing the cross-coupled inverters 130 and 140 to provide positive feedback that amplifies the difference between OUTP and OUTM. In the example in FIG. 2 where AMP_OP is greater than AMP_OM, the positive feedback causes PMOS transistor M8 to turn on and PMOS transistor M5 to stay turned off. The positive feedback also causes NMOS transistor M7 to turn off and NMOS transistor M4 to stay on. This allows the supply rail 112 to charge output capacitor Cop through PMOS transistor M8, causing output voltage OUTP to regenerate (increase), as shown in FIG. 2. Because PMOS transistor M5 stays off and NMOS transistor M4 stays on, drive current I1 is allowed to continue to discharge output capacitor Com, causing output voltage OUTM to decrease further, as shown in FIG. 2. If AMP_OM is greater than AMP_OP (not shown in FIG. 2), then the positive feedback may cause OUTM to regenerate (increase) and OUTP to decrease further.

In other words, when the cross-coupled inverters 130 and 140 are activated, the cross-coupled inverters 130 and 140 act as a back-to-back inverter latch that are driven into one of two output states based on the difference between the voltages at internal nodes NCM and NCP. More particularly, if the voltage at node NCM is lower than the voltage at node NCP, then the cross-coupled inverters 130 and 140 are driven to a first output state in which OUTP is greater than OUTM. If the voltage at node NCM is greater than the voltage at node NCP, then the cross-coupled inverters 130 and 140 are driven to a second output state in which OUTM is greater than OUTP.

Therefore, at the end of the sensing phase, the strong-arm latch 105 converts the differential input voltage (AMP_OP and AMP_OM) into a relatively large differential output voltage (OUTP and OUTM). The output voltages OUTP and OUTM may represent a logic one or logic zero depending on whether OUTP is greater than OUTM. For example, logic one may correspond to OUTP being greater than OUTM and logic zero may correspond to OUTM being greater than OUTP.

When the sampling clock signal CLK transitions back to low at the end of the sensing phase, the SR latch 120 latches the output voltages OUTP and OUTM of the strong-arm latch 105, and outputs the latched output voltages as a sample output. For example, if OUTP is greater than OUTM, then the sample output may be logic one, and, if OUTM is greater than OUTP, then the sample output may be logic zero. The SR latch 120 outputs the sample output corresponding to the latched output voltages OUTP and OUTM during the following reset phase of the strong-arm latch 105. Thus, the SR latch 120 converts the output voltages OUTP and OUTM generated during the sensing phase (CLK is high) into a bit having a logic value that depends on which of the output voltages is greater, and outputs the bit during the following reset phase (CLK is low). The output bit may be forwarded to other devices for further processing. For example, the input amplifier 110, strong-arm latch 105 and SR latch 120 may be used in a receiver (e.g., SerDes receiver) to receive an incoming data signal and convert the incoming data signal into a sequence of data bits that are processed by other devices (e.g., processor) coupled to the receiver.

When the differential input voltage (AMP_OP and AMP_OM) is approximately zero volts, it may be desirable for the output of the strong-arm latch 105 to be in a metastable state (i.e., toggle between logic one and logic zero). In this case, the threshold voltage for deciding whether a data sample is a logic one or logic zero is approximately zero volts. However, in practice, there is an offset voltage at the differential input of the strong-arm latch 105 that causes the output to be a logic one (i.e., OUTP greater than OUTM) or logic zero (i.e., OUTM greater than OUTP) when the differential input voltage is zero volts. In this case, the threshold voltage is offset from zero volts, which may lead to bit errors at the output of the SR latch 120. The offset voltage may be caused by component mismatches in the strong-arm latch 105 and/or other factors.

Figure 3:
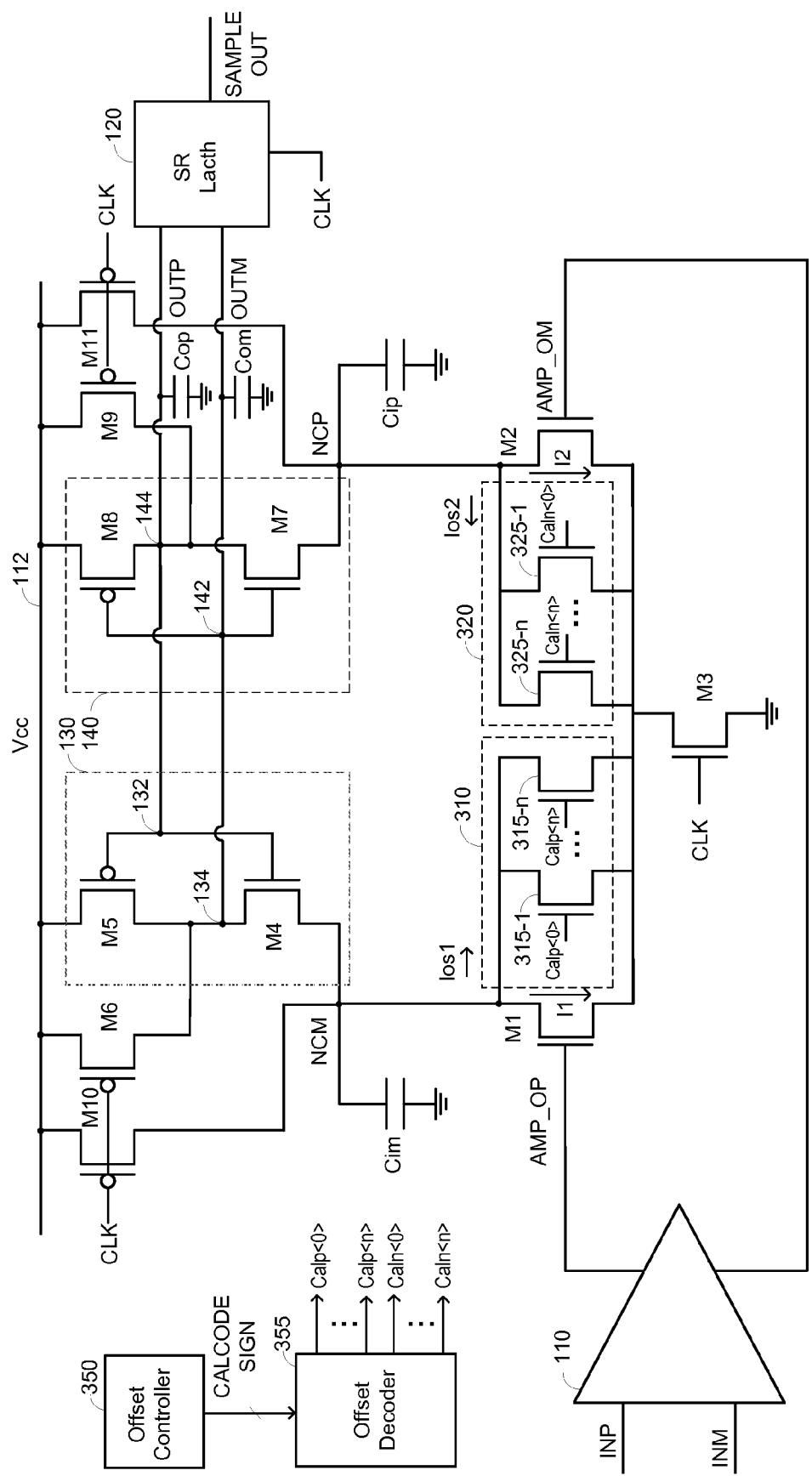
FIG. 3 shows an example of an offset-compensation system for reducing an offset voltage of the strong-arm latch according to certain aspects of the present disclosure.

The offset voltage may be reduced using an offset-compensation system. In this regard, FIG. 3 shows an example of an offset-compensation system configured to provide the strong-arm latch 105 in FIG. 1 with offset compensation. The offset-compensation system comprises a first offset-compensation circuit 310, a second offset-compensation circuit 320, an offset controller 350, and an offset decoder 355.

The first offset-compensation circuit 310 comprises a first plurality of compensation transistors 315-1 to 315-$n$ coupled in parallel between the drain and source of the first input NMOS transistor M1. The first offset-compensation 310 provides a first offset-compensation current Ios1 that is translated into an offset-compensation voltage at node NCM by capacitor Cim. The offset controller 350 is configured to control the magnitude of the first offset-compensation current Ios1 (and hence the offset-compensation voltage at node NCM) by controlling the number of compensation transistors 315-1 to 315-$n$ that are turned on. In the example in FIG. 3, the first plurality of compensation transistors 315-1 to 315-$n$ comprises n NMOS transistors, where n in an integer.

Thus, in this example, the offset controller 350 can set the first offset-compensation current Ios1 to any one of n values.

The second offset-compensation circuit 320 comprises a second plurality of compensation transistors 325-1 to 325-$n$ coupled in parallel between the drain and source of the second input NMOD transistor M2. The second offset-compensation 320 provides a second offset-compensation current Ios2 that is translated into an offset-compensation voltage at node NCP by capacitor Cip. The offset controller 350 is configured to control the magnitude of the second offset-compensation current Ios2 (and hence the offset-compensation voltage at node NCP) by controlling the number of compensation transistors 325-1 to 325-$n$ that are turned on. In the example in FIG. 3, the second plurality of compensation transistors 325-1 to 325-$n$ comprises n NMOS transistors. Thus, in this example, the offset controller 350 can set the second offset current Ios2 to any one of n values.

In operation, the offset controller 350 may reduce an offset voltage of the latch 105 by selectively turning on compensation transistors 315-1 to 315-$n$ and 325-1 to 325-$n$ in one of the first and second offset-compensation circuits 310 and 320 depending on the polarity of the offset voltage, as discussed further below. In this regard, the offset controller 350 may control the compensation transistors 315-1 to 315-$n$ and 325-1 to 325-$n$ by outputting a digital code (denoted "CALCODE") and a sign bit to the offset decoder 355. The sign bit specifies whether the first offset-compensation circuit 310 or second offset-compensation circuit 320 is used for offset compensation depending on the polarity of the offset voltage. The CALCODE specifies the number of compensation transistors in the selected offset-compensation circuit that are turned on.

The offset decoder 355 converts the CALCODE and sign bit into controls bits that are output to the gates of respective compensation transistors 315-1 to 315-$n$ and 325-1 to 325-$n$ to selectively turn on the compensation transistors according to the CALCODE and sign bit. For example, if the sign bit is one, then the offset decoder 355 outputs control bits Calp<0> to Calp<n> to the gates of respective compensation transistors 315-1 to 315-$n$ in the first offset-compensation circuit 310. In this example, if the CALCODE specifies that m transistors are to be turned on, then the offset decoder 355 may set m of the control bits Calp<0> to Calp<n> to one to turn on m of the compensation transistors 315-1 to 315-$n$ and set the remaining ones of the control bits Calp<0> to Calp<n> to zero.

If the sign bit is zero, then the offset decoder 355 outputs control bits Caln<0> to Caln<n> to the gates of respective compensation transistors 325-1 to 325-$n$ in the second offset-compensation circuit 320. In this example, if the CALCODE specifies that m transistors are to be turned on, then the offset decoder 355 may set m of the control bits Caln<0> to Caln<n> to one to turn on m of the compensation transistors 325-1 to 325-$n$ and set the remaining ones of the control bits Caln<0> to Caln<n> to zero. The control bits for the unselected one of the first and second offset-compensation circuits 310 and 320 may be all set to zero to turn off all of the transistors in the unselected second offset-compensation circuit. For ease of illustration, the individual connections between the offset decoder 355 and the compensation transistors 315-1 to 315-$n$ and 325-1 to 325-$n$ are not explicitly shown in FIG. 3.

In the example in FIG. 3, each of the compensation transistors comprises an NMOS transistor. Thus, in this example, a compensation transistor is turned on when the respective control bit is logic one (high) and turned off when the respective control bits is logic zero (low).

Figure 4:
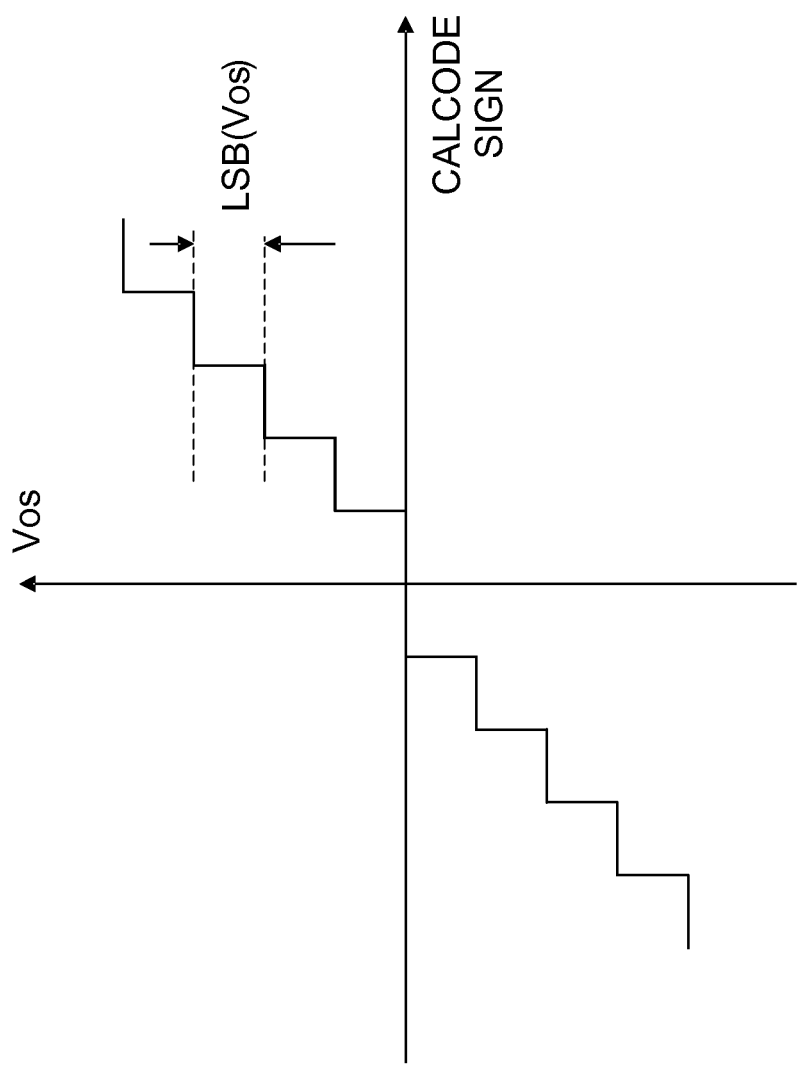
FIG. 4 is a plot showing an example of offset-compensation voltage as a function of an offset-compensation code according to certain aspects of the present disclosure.

FIG. 4 shows different offset-compensation voltages for different values of the CALCODE and sign bit. As shown in FIG. 4, the offset-compensation voltages are quantized with a step size denoted by "LSB(Vos)." Thus, if the offset voltage of the strong-arm latch 305 corresponds to an offset-compensation voltage between two adjacent quantized offset-compensation voltages, a residual offset voltage remains after offset compensation. The residual offset voltage may be referred to as quantization error of the offset compensation.

The step size of the offset-compensation voltages shown in FIG. 4 can be adjusted during the design phase by adjusting the channel widths of the compensation transistors 315-1 to 315-$n$ and 325-1 to 325-$n$. For example, the smaller the channel widths, the smaller the step size at the expense of a smaller offset-compensation range for a given number of compensation transistors. In a conventional planar CMOS fabrication process, the channel widths can be continuously varied, allowing the step size to be adjusted to approximately any value. However, a FinFET CMOS process may only support a discrete set of channel widths. As a result, the step sizes that may be available during the design phase may be restricted to a discrete set of step sizes corresponding to a discrete set of channel widths supported by the FinFET CMOS process. Thus, it may not be possible to achieve a desired step size using the FinFET CMOS process.

For example, a FinFET CMOS process may support channel widths corresponding to offset-compensation step sizes of 1 mV and 5 mV, but no channel width corresponding to a step size in between. In this example, the offset-compensation step size of 1 mV may not provide a large enough offset-compensation range to cover the offset voltage of the latch 105. The offset-compensation step size of 5 mV may provide a large enough offset-compensation range. However, the step size of 5 mV may result in a large quantization error of the offset compensation. In this example, an offset-compensation step size of 3 mV may provide a large enough offset-compensation range, while substantially reducing quantization error of the offset compensation compared with the step size of 5 mV. However, the offset-compensation step size of 3 mV is not support by the FinFET CMOS process in this example.

Embodiments of the present disclosure provide systems and methods for electronically adjusting (tuning) the offset-compensation step size LSB(Vos). This allows the offset-compensation step size to be adjusted with finer granularity, as discussed further below.

Figure 5:
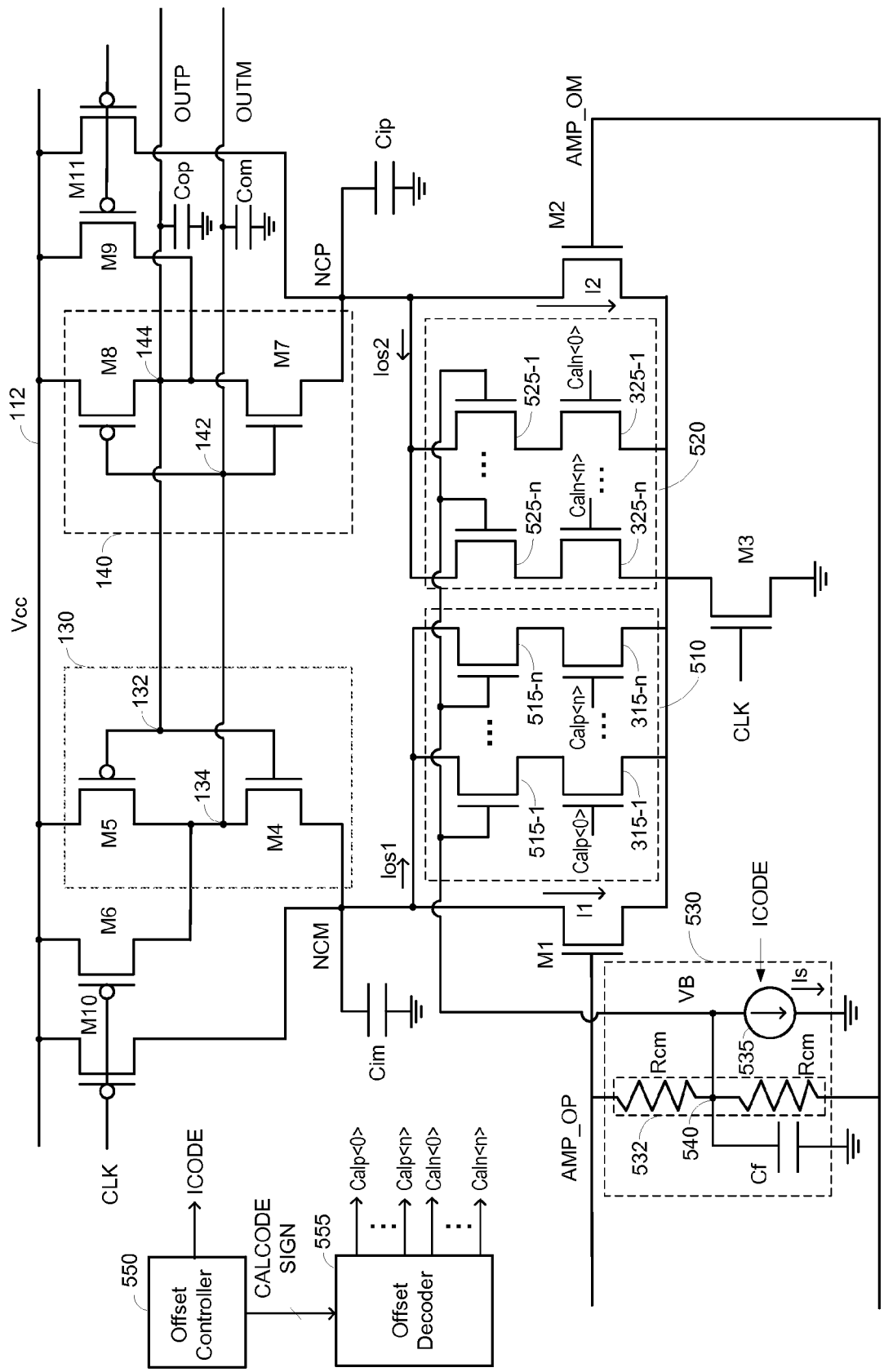
FIG. 5 shows an example of an offset-compensation system with an adjustable offset-compensation step size according to certain aspects of the present disclosure.

FIG. 5 shows an offset-compensation system for providing the strong-arm latch with offset compensation having an adjustable (tunable) offset-compensation step size according to certain aspects of the present disclosure. The offset-compensation system comprises a first offset-compensation circuit 510, a second offset-compensation circuit 520, an offset controller 550, an offset decoder 555, and a bias circuit 530. For ease of illustration, the input amplifier 110 and SR latch 120 are not shown in FIG. 5.

The first offset-compensation circuit 510 comprises the first plurality of compensation transistors 315-1 to 315-$n$, same as the first offset-compensation circuit 310 in FIG. 3. The first offset-compensation circuit 510 further comprises a first plurality of step-adjustment transistors 515-1 to 515-$n$, in which each of the step-adjustment transistors 515-1 to 515-$n$ is coupled in series with a respective one of the compensation transistors 315-1 to 315-$n$ (e.g., stacked on top of the respective one of the compensation transistors 315-1 to 315-$n$, as shown in FIG. 5). The gate of each of the step-adjustment transistors 515-1 to 515-$n$ is biased by a bias voltage VB from the bias circuit 530. As discussed further below, the bias voltage VB can be adjusted to adjust the offset-compensation step size of the first offset-compensation circuit 510.

The second offset-compensation circuit 520 comprises the second plurality of compensation transistors 325-1 to 325-$n$, same as the second offset-compensation circuit 320 in FIG. 3. The second offset-compensation circuit 520 further comprises a second plurality of step-adjustment transistors 525-1 to 525-$n$, in which each of the step-adjustment transistors 525-1 to 525-$n$ is coupled in series with a respective one of the compensation transistors 325-1 to 325-$n$ (e.g., stacked on top of the respective one of the compensation transistors 325-1 to 325-$n$, as shown in FIG. 5). The gate of each of the step-adjustment transistors 525-1 to 525-$n$ is biased by the bias voltage VB from the bias circuit 530. As discussed further below, the bias voltage VB can be adjusted to adjust the offset-compensation step size of the second offset-compensation circuit 520.

In operation, the bias voltage VB from the bias circuit 530 controls the channel conductance of each of the step-adjustment transistors 515-1 to 515-$n$ and 525-1 to 525-$n$. The channel conductance of each step-adjustment transistor, in turn, controls the amount of current that flows into the respective compensation transistor when the respective compensation transistors is turned on by the respective control bit from the offset decoder 555. Thus, the bias voltage VB controls the amount of offset-compensation current provided by each compensation transistor, and hence controls the step size LSB(Vos) of the offset compensation. The lower the bias voltage VB, the smaller the step size LSB(Vos). Therefore, the step size LSB(Vos) of the offset compensation can be adjusted by adjusting the bias voltage VB applied to the gates of the step-adjustment transistors 515-1 to 515-$n$ and 525-1 to 525-$n$ by the bias circuit 530.

Each step-adjustment transistor and respective compensation transistor may be considered an offset-compensation segment. Each segment provides an offset-compensation current corresponding to one step size when the respective compensation transistor is turned on, in which the step size depends on the bias voltage VB applied to the gate of the respective step-adjustment transistor.

In the example in FIG. 5, the bias circuit 530 comprises a resistor network 532 including two resistors Rcm coupled in series between the inputs of the strong-arm latch 505. The bias voltage VB is provided at the node 540 between the two resistors Rcm, as shown in FIG. 5. The bias circuit 530 also comprises a tunable current source 535 configured to generate a current Is that is tuned by a digital code (denoted "ICODE") from the offset controller 550. The tunable current source 535 is coupled to the node 540 between the two resistors Rcm, as shown in FIG. 5. The bias circuit 530 may also comprise a capacitor Cf coupled between the node 540 and ground. The capacitor Cf and resistors Rcm form a low-pass filter that attenuates noise from the input voltages AMP_OP and AMP_OM to reduce the impact of the noise on the bias voltage VB.

Figure 6A:
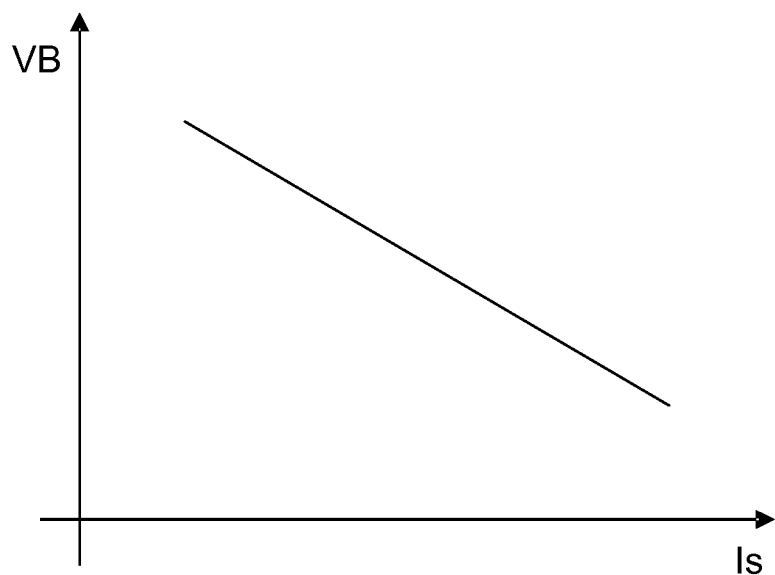
FIG. 6A is a plot showing an example of bias voltage as a function of current according to certain aspects of the present disclosure.
Figure 6B:
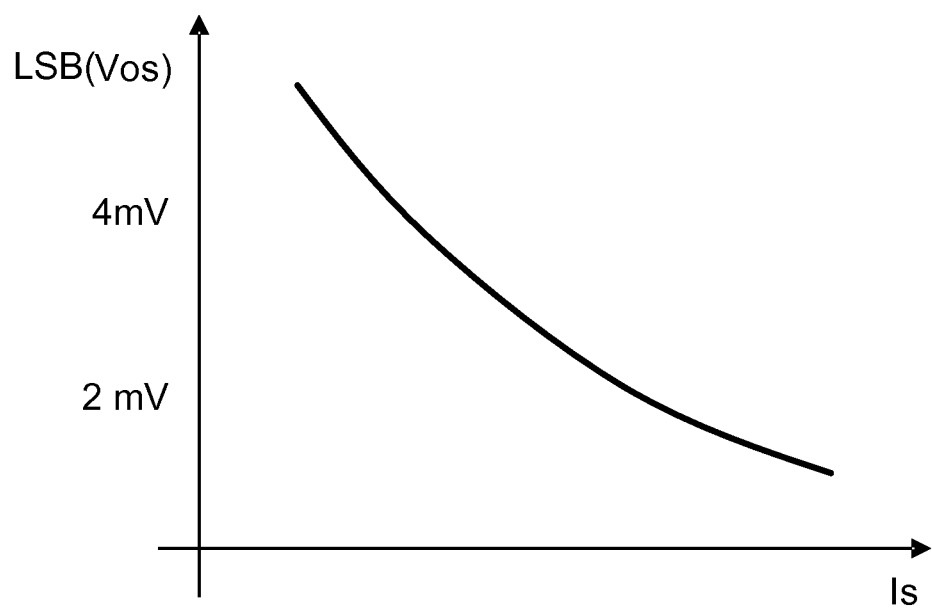
FIG. 6B is a plot showing an example of offset-compensation step size as a function of current according to certain aspects of the present disclosure.

The bias voltage VB provided by the bias circuit 530 is approximately given by:

$$VB = (AMP\_OP + AMP\_OM)/2 - Rcm * Is/2 \quad (1)$$

where AMP_OP and AMP_OM are the input voltages to the latch 105, Rcm in equation (1) is the resistance of each of the resistors Rcm, and Is is the current of the current source 535 (which is set by the ICODE). Thus, the bias voltage (and hence the step size LSB(Vos)) can be tuned by tuning the current Is of the tunable current source 535. In this regard, FIG. 6A shows an example of the bias voltage VB as a function of the current Is. In this example, the bias voltage is approximately a linear function of the current Is. The higher the current Is, the lower the bias voltage VB, and hence the smaller the offset-compensation step size LSB (Vos). FIG. 6B shows an example of the offset-compensation step size LSB(Vos) as a function of the current Is of the tunable current source 535. As shown in FIG. 6B, the step size LSB(Vos) can be reduced by increasing the current Is.

As discussed above, the current Is is controlled by the ICODE from the offset controller 550. This allows the offset controller 550 to adjust (tune) the current Is (and hence the bias voltage VB and step size LSB(Vos)) by adjusting the digital code ICODE accordingly. In certain aspects, the ICODE may have k different values corresponding to k different current settings of the current source 535 (and hence k different settings for the bias voltage VB and step size LSB(Vos)). This allows the offset controller 550 to adjust the offset-compensation step size LSB(Vos) to any one of k values by adjusting the digital code ICODE accordingly. In one aspect, one of the current settings of the current source 535 may correspond to approximately no current. In this aspect, the corresponding bias voltage may be approximately equal to (AMP_OP+AMP_OM)/2, which is the common-mode voltage of the differential input voltage. The value of k may be three or greater, four or greater, or five or greater.

For a given offset-compensation step size, the offset controller 550 adjusts the offset-compensation voltage by adjusting the CALCODE and sign bit output to the offset decoder 555. The sign bit specifies whether the first offset-compensation circuit 510 or second offset-compensation circuit 520 is used for offset compensation depending on the polarity of the offset voltage, and the CALCODE specifies the number of compensation transistors that are tuned on in the selected offset-compensation circuit. The offset decoder 555 converts the CALCODE and sign bit into controls bits that are output to the gates of respective compensation transistors 515-1 to 515-$n$ and 525-1 to 525-$n$ to selectively turn on the compensation transistors according to the CALCODE and sign bit. The offset decoder 555 may operate in a similar manner as the offset decoder 355 in FIG. 3 discussed above, in which the offset decoder 555 selectively turns on the compensation transistors 315-1 to 315-$n$ in the first offset-compensation circuit 510 using control bits Calp<0> to Calp<n>, and selectively turns on the compensation transistors 325-1 to 325-$n$ in the second offset-compensation circuit 520 using control bits Caln<0> to Caln<n>.

Thus, the offset controller 550 is able to adjust (tune) both the offset-compensation current using the CALCODE and sign bit, and the offset-compensation step size LSB(Vos) using the ICODE. This provides greater flexibility in adjusting the offset-compensation voltage compared with the offset-compensation system in FIG. 3, and therefore provides better offset-voltage cancellation for higher performance.

A method for determining an ICODE setting that achieves a desired offset-compensation range will now be described according to certain aspects. In one example, the method may be performed using a circuit simulation tool that simulates the strong-arm latch 105 and the offset-compensation system. In this example, an external offset voltage may be applied to the differential input of the strong-arm latch 105 to simulate an offset voltage. More particularly, different input voltages may be input to the gates of the first and second input transistors M1 and M2, in which the difference between the input voltages is approximately equal to the input offset voltage. Thus, in this example, the external input offset voltage is applied to the differential input of the latch 105 to simulate an offset voltage of the latch 105. The input offset voltage causes the SR latch 120 to output a logic one or logic zero depending on the polarity of the input offset voltage. For example, if the input offset voltage is positive (i.e., input voltage to the first input transistor M2 is higher than the input voltage to the second input transistor M2), then the input offset voltage causes the SR latch 120 to output a logic one.

The input offset voltage may correspond to a desired offset-compensation range for the offset-compensation system. For example, if the desired offset-compensation range is approximately 30 mV, then the input offset voltage may be set to slightly less than 30 mV. The offset-compensation range may be a range that covers all or most variations in the offset voltages of physical devices due to, for example, process variations. In this example, the offset-compensation range may represent the maximum magnitude of the offset voltage for which the offset-compensation system can compensate for a given step size setting.

After the input offset voltage is applied to the differential input of the latch 105, the ICODE may be set to the smallest step size LSB(Vos) setting to determine whether the smallest step size satisfies the desired offset-compensation range. The smallest step size setting corresponds to the highest current setting of the current source 535. After the step size is set to the smallest setting, all of the compensation transistors in one of the first and second compensation circuits 510 and 520 may be turned on depending on the polarity of the input offset voltage. For example, if the input offset voltage is positive, then all of the compensation transistors 525-1 to 525-$n$ in the second compensation circuit 520 may be turned on. This corresponds to the maximum offset-compensation voltage for the current step size setting, and therefore the offset-compensation range for the current step size setting. The output of the SR latch 120 is observed before and after the compensation transistors 525-1 to 525-$n$ are turned on to determine whether the output transitions from logic one to logic zero. A transition indicates that the current step size setting satisfies the desired offset-compensation range. No transition (i.e., output stays at logic one) indicates that the current step size setting does not satisfy the desired offset-compensation range.

The range may also be determined by applying a negative offset voltage to the differential input of the latch 105 corresponding to the desired range. This assumes that the first and second offset compensation circuits are symmetrical. In this example, all of the compensation transistors 515-1 to 515-$n$ in the first compensation circuit 510 are turned on, and a determination is made whether the output of the SR latch 120 transitions from logic zero to logic one. A transition indicates that the current step size setting satisfies the desired offset-compensation range. No transition (i.e., output stays at logic zero) indicates that the current step size setting does not satisfy the desired offset-compensation range.

If the smallest step size setting satisfies the desired offset-compensation range, then the ICODE setting for the smallest step size setting may be determined to satisfy the desired range. If the smallest step size setting does not satisfy the desired offset-compensation range, then the ICODE may be changed to a first larger step size setting (next larger step size setting after the smallest step size setting). This reduces the current Is of the current source 535 to the next lower current setting, which increases the bias voltage VB, and hence increases the offset-compensation step size. After the ICODE is changed, the steps discussed above may be repeated to determine whether the first larger step size setting satisfies the desired offset-compensation range. If the first larger step size setting satisfies the desired offset-compensation range, then the ICODE setting for the first step size setting may be determined to satisfy the desired range. If the first larger step size setting does not satisfy the desired offset-compensation range, then the ICODE may be changed to a second larger step size setting (next larger step size setting after the first step size setting). After the ICODE is changed to the second larger step size setting, the steps discussed above may be repeated to determine whether the second larger step size setting satisfies the desired offset-compensation range. If the second larger step size setting satisfies the desired offset-compensation range, then the ICODE setting for the second larger step size setting may be determined to satisfy the desired range. If the second larger step size setting does not satisfy the desired offset-compensation range, then the ICODE may be changed to a third larger step size setting (next larger step size setting after the second larger step size setting), and so forth.

Thus, the method discussed above determines the ICODE setting corresponding to the lowest step size setting that satisfies the desired offset-compensation range. After the ICODE setting is determined, the determined ICODE setting may be programmed into the offset controller 550 of one or more physical devices. In operation, the offset controller 550 outputs the programmed ICODE to the current source 535 to set the step size of the first and second compensation circuits 510 and 520.

As discussed above, offset voltage may vary from device to device due to, for example, process variations. In this regard, the offset controller 550 may perform an offset-calibration procedure to determine the CALCODE setting and sign bit value that provide offset compensation for the latch 105. The procedure may include applying a differential voltage of approximately zero volts to the differential inputs of the latch 105. This may be done, for example, by shorting the inputs of the input amplifier 110. For example, the controller 550 may short the inputs of the input amplifier 110 by closing a switch (not shown) coupled between the inputs. The switch may be open during normal operation of the amplifier 110. Because of the offset voltage of the latch 105, the output of the SR latch 120 is a logic one or logic zero depending on the polarity of the offset voltage.

The controller 550 may then observe the output of the SR latch 120 to determine whether the output is logic one or logic zero. The controller 550 may observe the output of the SR latch 120 by closing a switch (not shown) coupled between the output of the SR latch 120 and the controller 550. The switch may be open during normal operation.

If the observed output is logic one, then the controller 550 may turn on the compensation transistors 525-1 to 525-$n$ in the second compensation circuit 520 one by one while observing the output for changes. The controller 550 may turn on the compensation transistors 525-1 to 525-$n$ one by one by setting the sign bit to zero and changing the CAL-CODE to incrementally turn on the compensation transistors 525-1 to 525-$n$. When the output of the SR latch 120 changes (i.e., crosses from one to zero), the controller 550 determines the number of compensation transistors 525-1 to 525-$n$ that are turned on when the change occurs. The controller 550 may then store the CALCODE setting corresponding to the determined number of compensation transistors 525-1 to 525-$n$ and a sign bit of zero in memory. During normal operation, the controller 550 may set the CALCODE and sign bit according the stored CALCODE setting and sign bit value to provide offset compensation.

If the observed output during the calibration procedure is logic zero, then the controller 550 may turn on the compensation transistors 515-1 to 515-$n$ in the first compensation circuit 510 one by one while observing the output for changes. The controller 510 may turn on the compensation transistors 515-1 to 515-$n$ one by one by setting the sign bit to one and changing the CALCODE to incrementally turn on the compensation transistors 515-1 to 515-$n$. When the output of the SR latch 120 changes (i.e., crosses from zero to one), the controller 550 determines the number of compensation transistors 515-1 to 515-$n$ that are turned on when the change occurs. The controller 550 may then store the CALCODE setting corresponding to the determined number of compensation transistors and a sign bit of one in memory. During normal operation, the controller 550 may set the CALCODE and sign bit according to the stored CALCODE bits and sign bit value to provide offset compensation.

As discussed above, the ICODE setting may be determined during the design phase and pre-programmed into the offset controller 550. The offset controller 550 may also determine the ICODE setting during a step-size calibration procedure. In this regard, the offset controller 550 may apply a differential voltage of approximately zero volts to the differential inputs of the latch 105, as discussed above, and set ICODE to the smallest step size setting. The offset controller 550 may then perform the offset-calibration procedure discussed above to determine if the offset voltage of the latch 105 can be compensated at the smallest step-size. If the offset voltage is successfully compensated, the offset controller 550 stores the CALCODE setting and the sign bit value determined during the offset calibration procedure in memory. The offset controller 550 may also store the ICODE setting for the smallest step size setting in memory. During normal operation, the offset controller 550 sets the CAL-CODE, sign bit and ICODE according to the stored CAL-CODE setting, sign bit value and ICODE setting.

If the offset-calibration procedure for the smallest step size fails to compensate the offset voltage, then the offset controller 550 changes ICODE to a first larger step size setting (next larger step size setting after the smallest step size setting). The offset controller 550 may then repeat the offset-calibration procedure for the first larger step size setting. If the offset voltage is successfully compensated, the offset controller 550 stores the CALCODE setting and the sign bit value determined during the offset-calibration procedure in memory. The offset controller 550 may also store the ICODE setting for the first larger step size setting in memory. During normal operation, the offset controller 550 sets the CALCODE, sign bit and the ICODE according to the stored CALCODE setting, sign bit value and ICODE setting.

If the offset calibration procedure fails for the first larger step size setting, then the offset controller 550 changes ICODE to a second larger step size setting (next larger step size setting after the first larger step size setting). The offset controller 550 may then repeat the offset-calibration procedure for the second larger step size setting, and so forth. Thus, the offset controller 550 may determine and store the ICODE setting, CALCODE setting and sign bit value that provide offset compensation for a particular device. During normal operation, the offset controller 550 sets the CAL-CODE, sign bit and ICODE according to the stored CAL-CODE setting, sign bit value and ICODE setting.

Figure 7:
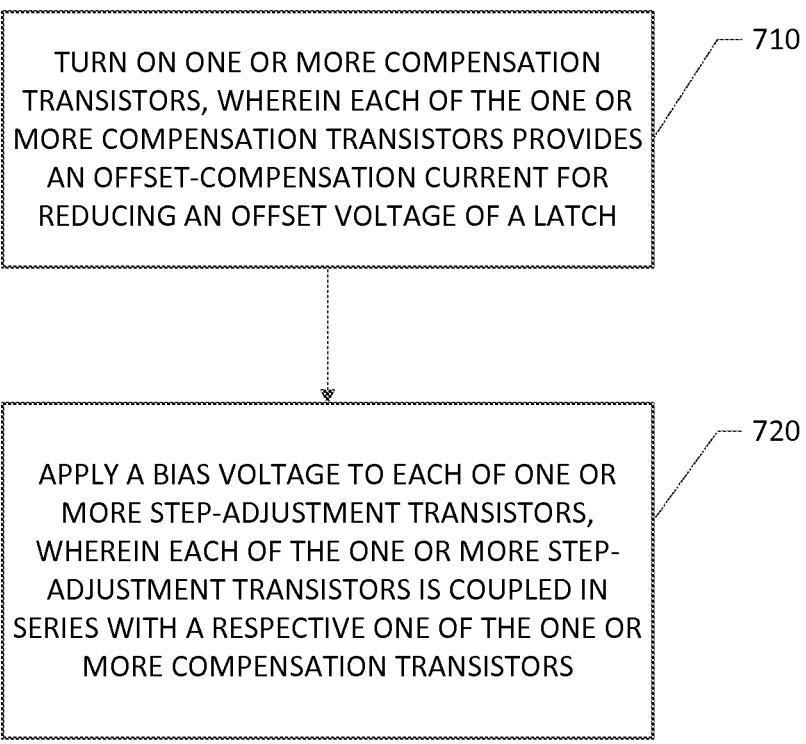
FIG. 7 is a flowchart showing a method for offset-voltage compensation according to certain aspects of the present disclosure.

FIG. 7 is a flowchart illustrating a method 700 for offset-voltage compensation according to certain aspects of the present disclosure. The method 700 may be performed by the offset compensation system in FIG. 5.

In step 710, one or more compensation transistors are turned on, wherein each of the one or more compensation transistors provides an offset-compensation current for reducing an offset voltage of a latch. For example, an offset controller (e.g., offset controller 550) may turn on one or more of the compensation transistors (e.g., compensation transistors 315-1 to 315-n) to reduce the offset voltage. In one example, the number of compensation transistors that are turned on may depend on the magnitude of the offset voltage, in which the number may be determined during an offset-calibration procedure, as discussed above.

In step 720, a bias voltage is applied to a gate of each of one or more step-adjustment transistors, wherein each of the one or more step-adjustment transistors is coupled in series with a respective one of the one or more compensation transistors. For example, a bias circuit (e.g., bias circuit 530) may apply the voltage bias (e.g., VB) to the gate of each of the one or more step-adjustment transistors (e.g., step-adjustment transistors 515-1 to 515-n) to control the offset-compensation current of the respective compensation transistor.

Those skilled in the art would appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A receiver, comprising:
    a latch configured to sample a data signal according to a sampling clock signal;
    a plurality of offset-compensation segments, wherein each of the segments is coupled to an internal node of the latch, and each of the segments comprises:
        a compensation transistor; and
        a step-adjustment transistor coupled in series with the compensation transistor;
    an offset controller configured to selectively turn on one or more of the compensation transistors to reduce an offset voltage of the latch; and
    a bias circuit configured to apply a bias voltage to a gate of each of one or more of the step-adjustment transistors;
    wherein the offset controller is configured to output a code to the bias circuit indicating one of k different voltages, k is an integer, and the bias circuit is configured to set the bias voltage to the one of the k voltages indicated in the code.

2. The receiver of claim 1, wherein k is three or greater.

3. The receiver of claim 1, wherein the offset controller is configured to output a plurality of control bits, each of the control bits controlling whether a respective one of the compensation transistors is turned on.

4. The receiver of claim 1, wherein the latch comprises:
cross-coupled inverters, wherein an input of a first one of the inverters is coupled to an output of a second one of the inverters, and an output of the first one of the inverters is coupled to an input of the second one of the inverters; and
first and second input transistors coupled to the cross-coupled inverters, wherein the first and second inputs transistors are configured to drive the cross-coupled inverters into one of two output states based on the data signal, and the internal node of the latch is between the cross-coupled inverters and the first and second input transistors.

5. The receiver of claim 4, wherein each of the segments is coupled between a drain and source of the first input transistor.

6. The receiver of claim 5, further comprising a switching transistor configured to couple the source of the first input transistor to a ground during a sensing phase of the sampling clock signal and to decouple the source of the first input from the ground transistor during a reset phase of the sampling clock signal.

7. The receiver of claim 5, wherein k is three or greater.

8. The receiver of claim 1, wherein the bias circuit comprises:
first and second resistors coupled in series between first and second inputs of the latch; and
a current source coupled to a node between the first and second resistors, wherein the bias voltage is generated at the node between the first and second resistors.

9. A method for offset-voltage compensation, comprising:
turning on one or more compensation transistors, wherein each of the one or more compensation transistors provides an offset-compensation current for reducing an offset voltage of a latch;
applying a bias voltage to a gate of each of one or more step-adjustment transistors, wherein each of the one or more step-adjustment transistors is coupled in series with a respective one of the one or more compensation transistors;
receiving a code indicating one of k different voltages, wherein k is an integer; and
setting the bias voltage to the one of the k voltages indicated in the code.

10. The method of claim 9, wherein k is three or greater.

11. The method of claim 9, further comprising supplying a current to a resistor network to generate the bias voltage.

12. The method of claim 11, wherein k is three or greater.

13. An apparatus for offset-voltage compensation, comprising:
means for turning on one or more compensation transistors, wherein each of the one or more compensation transistors provides an offset-compensation current for reducing an offset voltage of a latch;
means for applying a bias voltage to a gate of each of one or more step-adjustment transistors, wherein each of the one or more step-adjustment transistors is coupled in series to a respective one of the one or more compensation transistors;
means for receiving a code indicating one of k different voltages, wherein k is an integer; and
means for setting the bias voltage to the one of the k voltages indicated in the code.

14. The apparatus of claim 13, wherein k is three or greater.

15. The apparatus of claim 13, further comprising means for supplying a current to a resistor network to generate the bias voltage.

16. The apparatus of claim 15, wherein k is three or greater.

* * * * *